United States Patent
Toda

[11] Patent Number: 5,185,724
[45] Date of Patent: Feb. 9, 1993

[54] IMAGE MEMORY
[75] Inventor: Haruki Toda, Yokohama, Japan
[73] Assignee: Kabushiki Kaisha Toshiba, Kawasaki, Japan
[21] Appl. No.: 586,232
[22] Filed: Sep. 21, 1990
[30] Foreign Application Priority Data
Sep. 22, 1989 [JP] Japan .................................. 1-247570
[51] Int. Cl.⁵ .............................................. G11C 7/00
[52] U.S. Cl. .............................. 365/234; 365/230.09; 365/240
[58] Field of Search .............. 340/798, 799; 365/239, 365/242, 230.09, 234, 235, 215

[56] References Cited
U.S. PATENT DOCUMENTS
4,796,231 1/1989 Pinkham .............................. 365/235

FOREIGN PATENT DOCUMENTS
0171518 2/1986 European Pat. Off. .
0246767 11/1987 European Pat. Off. .

Primary Examiner—Joseph A. Popek
Attorney, Agent, or Firm—Foley & Lardner

[57] ABSTRACT

An image memory comprises a random access memory, a serial access memory including a main register and a preregister, a data transfer section for carrying out data transfer between the random access memory and the serial access memory, and a designation section for designating an address of serial access. The data transfer section serves to transfer data from the random access memory to the main register of the serial access memory through the preregister. Furthermore, a serial access to the serial access memory is made on the basis of an address designated by the designation means. Thus, a transfer system defined as a hidden transfer for carrying out data transfer only between the random access memory and the preregister is set as a technique for relaxing the restriction on the transfer timings. This technique permits the serial access memory to be used with the divided or split segments having arbitrary lengths, respectively.

7 Claims, 13 Drawing Sheets

FIG. IIA PRIOR ART

FIG. IIB PRIOR ART

IMAGE MEMORY

BACKGROUND OF THE INVENTION

This invention relates to an image memory.

Figure 8A:
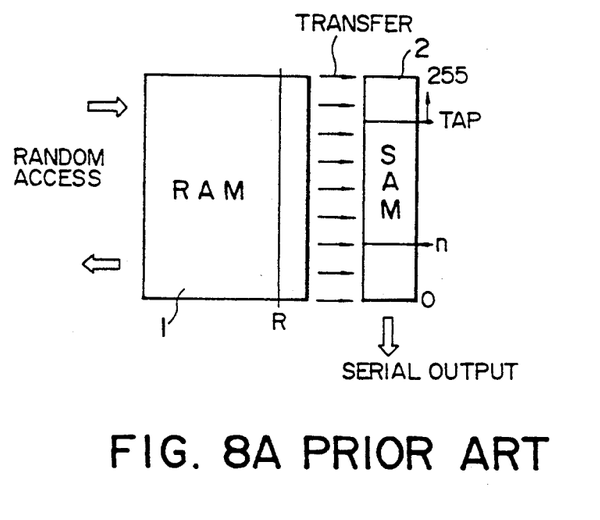
FIGS. 8A and 8B are explanatory views for explaining a conventional image memory, respectively.

In memories suitable for high speed data processing and in engineering work stations (EWSs) or computer graphics (CG), etc. and display thereof, attention in recent years has been drawn to dual port video RAMs (hereinafter referred to as DPRAMs). Such DPRAMs are provided with a random access port (hereinafter referred to as a RAM port) including a memory array accessible at random (e.g., a DRAM), and a serial access port (hereinafter referred to as a SAM port) including a serial access memory cyclically and serially accessed asynchronously with the RAM port. In such DRAMs, since data is transferred between the RAM port and the SAM port, it is necessary that the timing at the RAM port and the timing at the SAM port be caused to be synchronous with each other only at the time of this transfer cycle. The timings in this transfer cycle will be described with reference to FIGS. 8A and 8B. In the case of data transfer of a certain row R of a memory array 1 of the RAM port to a serial access memory 2 of the SAM port, which is incessantly making a serial access (see FIG. 8A), a procedure is taken to make first external signal $\overline{DT}$ for controlling transfer (see time $T_1$ of FIG. 8B) fall. If the external signal $\overline{DT}$ is at "L" level at the time when the signal $\overline{RAS}$ falls, the operational mode enters the transfer cycle.

In this transfer cycle, in the same manner as that in an ordinary RAM cycle, a row address and a column address are given synchronously with falls of $\overline{RAS}$ and $\overline{CAS}$ (see times $T_2$ and $T_3$ of FIG. 8B), respectively. Unlike the ordinary RAM cycle, the row address indicates a row of the memory array 1 to be transferred, and the column address indicates a TAP address serving as a position initiating a new serial cycle after completion of transfer. From the next serial cycle (see time $T_6$ of FIG. 8B) when the external signal $\overline{DT}$ has risen, transferred data is outputted with the TAP address being as a leading address. It is necessary that the rise timing (time $T_5$) of the external signal $\overline{DT}$ be in a time period from the rise (time $T_4$) of the serial clock signal SC to the next rise thereof (time $T_6$). Accordingly, there are restrictions in the time intervals $t_1$ ($=T_5-T_4$) and $t_2$ ($=T_6-T_5$). Furthermore, since the cycle time of the serial clock signal SC is 30 to 40 nsec, restrictions on the time intervals $t_1$ and $t_2$ are severe in application. To relax this, a split transfer system has been proposed.

This system is briefly described in NIKKEI ELECTRONICS No. 431, p. 126, Oct. 5, 1987.

Figure 9A:
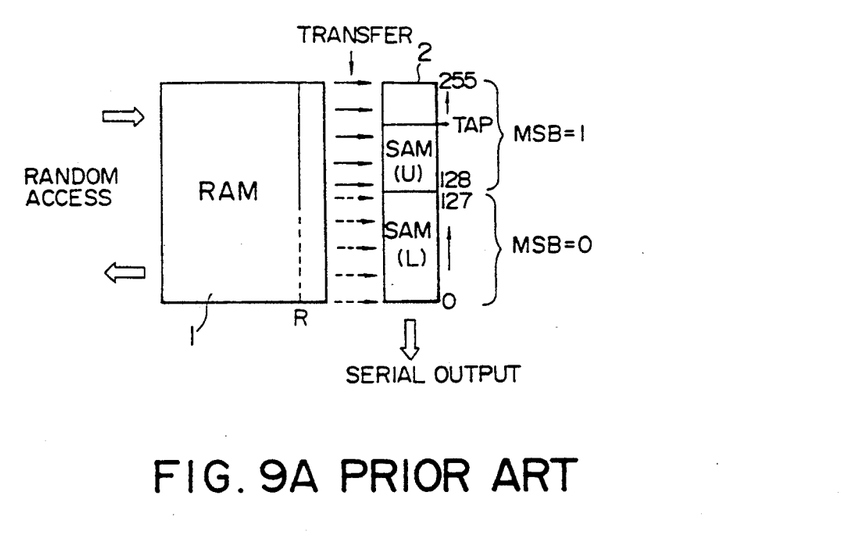
FIGS. 9A and 9B are explanatory views for explaining a conventional split transfer system, respectively.
Figure 9B:
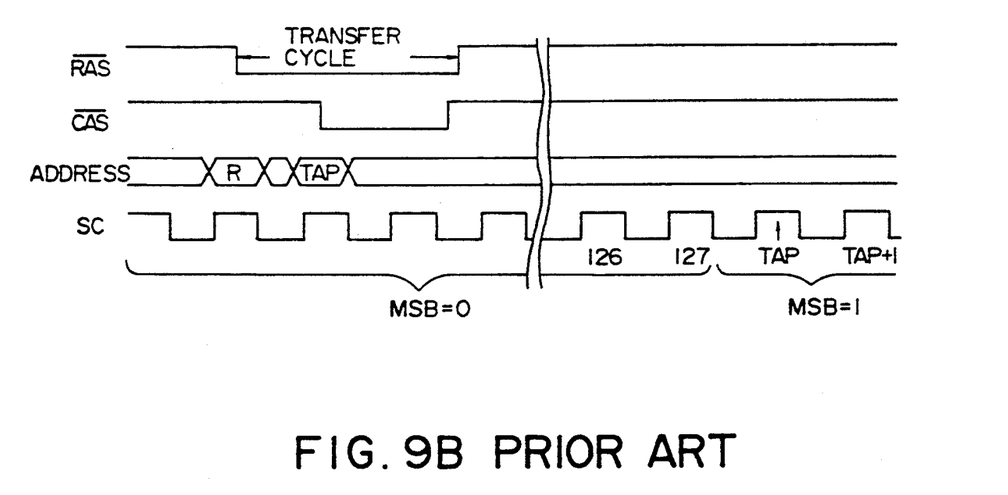

This split transfer system will be described with reference to FIGS. 9A and 9B. The serial access memory 2 of the SAM port in which the split transfer system is used is split or divided into two sections of SAM (L) and SAM (U) as shown in FIG. 9A. These split SAM (L) and SAM (U) correspond to "0" and "1" of the most significant bit (hereinafter referred to as MSB) of the TAP address, respectively. Thus, independent data transfer can be made, respectively. Now will be considered the case where a transfer cycle takes place when SAM (L) is subjected to serial access to carry out transfer of the row R of the memory array 1 of the RAM port. In the same manner as in the case of FIG. 8A, the row address indicates the row R. MSB of the TAP address is disregarded and is set to MSB ("1" in this case) on the side where no serial access is conducted.

In this case, the SAM (U) on the side of the set MSB carries out the transfer operation. The transferred data is accessed from a TAP address where MSB is newly set when serial access advances to shift from SAM (L) to SAM (U). In the case shown in FIGS. 9A and 9B, when a transfer cycle takes place for a time period of the serial addresses 0 to 127, the serial addresses 128 to 255 are subjected to transferring operation from the portion corresponding to the row R. When the serial access advances to 127 to enter the next SC cycle, TAP address is accessed. Serial access is therefore continued further. As stated above, the split serial access memory section where serial access is carried out and the split serial access memory section where transfer is carried out are different from each other, and an address of the preceding cycle where an access to the TAP address is made is determined. Accordingly, restriction on the timings as in the case of FIGS. 8A and 8B does not exist.

Consideration will now be made in connection with the method of constituting a data buffer for implementing high speed processing to display picture data using such a split transfer system.

As a random access memory of DPRAM, a DRAM is used. For this reason, by using the page mode of DRAM, it is possible to access data of the same row in a time one half to one third of a time in the case where the row address changes. Further, data of one row corresponds to data serially outputted from the SAM section, and the serial data serves as pixel data of a picture displayed. How these pixels are arranged as a picture is important for high speed picture processing. From a viewpoint of processing of picture, the method of processing, at a high speed, pixels in areas approximating a square permits high speed processing for any image pattern. Namely, high speed picture processing can be made in any longitudinal, lateral, or oblique direction. Thus, how data of one row which can be accessed in the page mode are allocated in a longitudinal direction with respect to the scanning direction of a picture displayed becomes important.

Consider the case where a picture is composed of an array including four DPRAMs in a scanning direction and four DPRAMs in a longitudinal direction, i.e., an array of 4×4 is employed as a tile.

Figure 10A:
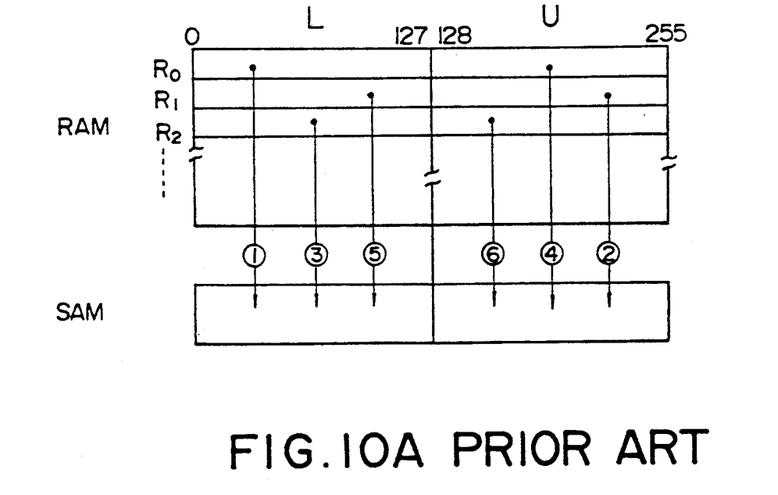
FIGS. 10A and 10B are explanatory views for explaining a conventional transfer method in which a pixel area close to a square as far as possible is accessible in a page mode cycle by the split transfer system, respectively.
Figure 10B:
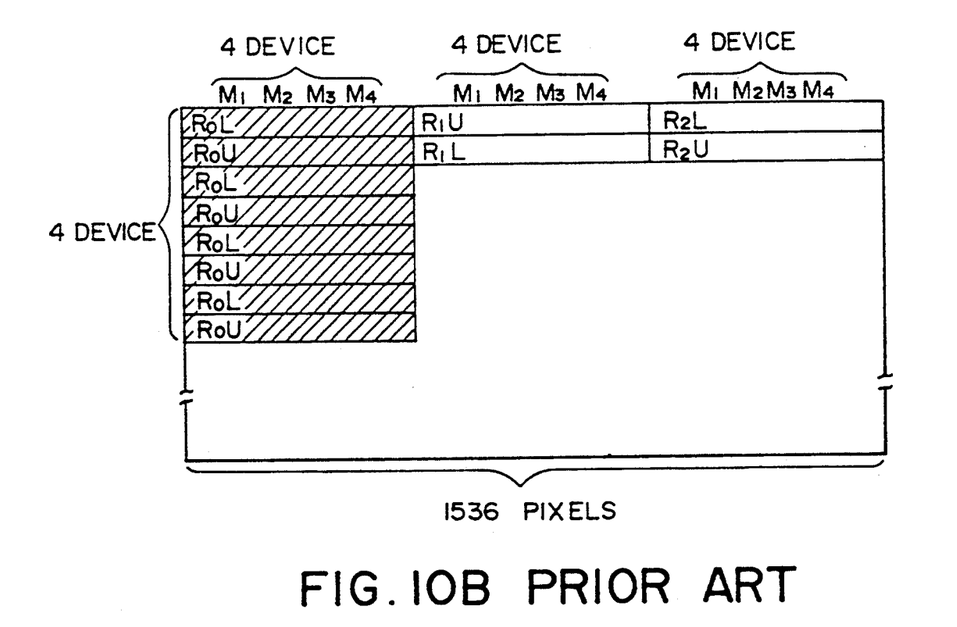

FIGS. 10A and 10B show the case where there is employed a DPRAM of the split transfer system having data of one row of 256 bits and the depth of a serial access memory (hereinafter referred to as a SAM) of 256 bits. Further, the picture size is assumed to be 1536 pixels in a scanning direction for brevity of explanation. In FIG. 10A, R0, R1, R2, ... represent rows of a random access memory (hereinafter referred to as a RAM), respectively. L of 0 to 127 and U of 128 to 255 in the column direction represent columns where data are transferred to bisected SAMs in the split transfer, respectively. Since the section in the scanning direction is composed of four devices $M_1$, $M_2$, $M_3$, and $M_4$, 1536 pixels in the scanning direction correspond to data corresponding to three split segmented SAM ($=1536/(4\times128)$). Accordingly, when L and U of the segmented SAMs are allocated to pixels in a longitudinal direction, it is possible to conduct picture processing of an area closer to a square by an access in a page mode of one row. Namely, data of the RAM section are subjected to a split transfer in order of R0L, R1U, R2L, R0U, R1L, R2U, ... Since data are serially outputted from the SAM section to scan pixels, the configuration of data as a picture is such that the area indicated by slanting lines of FIG. 10B is composed of data of the row R0. This area can be subjected to an access of any portion in the page mode. Accordingly, the picture is covered with tiles of slanting lines shown in FIG. 10B such that it can be accessed in the page mode. Thus, high speed picture processing can be conducted.

Figure 11A:
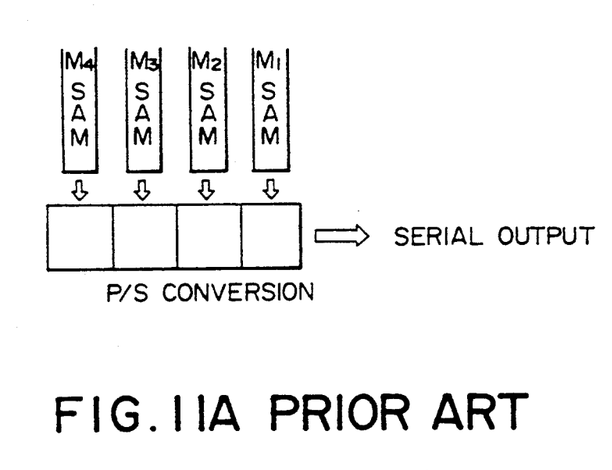
FIGS. 11A and 11B are explanatory views for explaining the correspondence between the SAM port and pixels in a scanning direction of four devices, respectively.
Figure 11B:
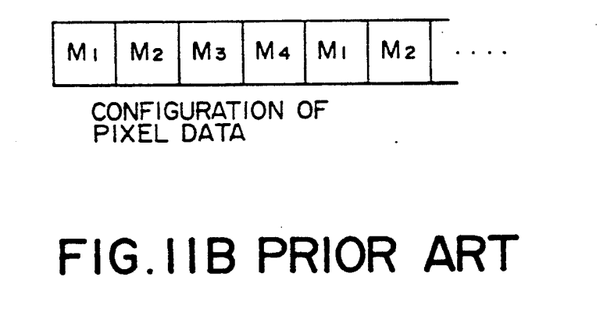

Further, more detailed consideration of the data configuration in the scanning direction will now be made. How pixels are constructed from serial data of four DPRAMs is shown in FIGS. 11A and 11B. Data from the SAM 2 of the devices M1 to M4 are subjected to parallel-to-serial conversion as shown in FIG. 11A, and are outputted as serial data to constitute pixels one by one. Thus, it is sufficient to make a serial access from SAM 2 at a speed one fourth that of the serial out for display of picture, thus making it possible to lessen the load on the SAM 2. Pixel data when such a parallel-to-serial conversion is carried out, are repeated in sequence as data from the DPRAM of M1, M2, M3, and M4 in order (see FIG. 11B). The frame of R0L, etc. of the tile which has been described with reference to FIG. 10B is of such a data structure.

Figure 12A:
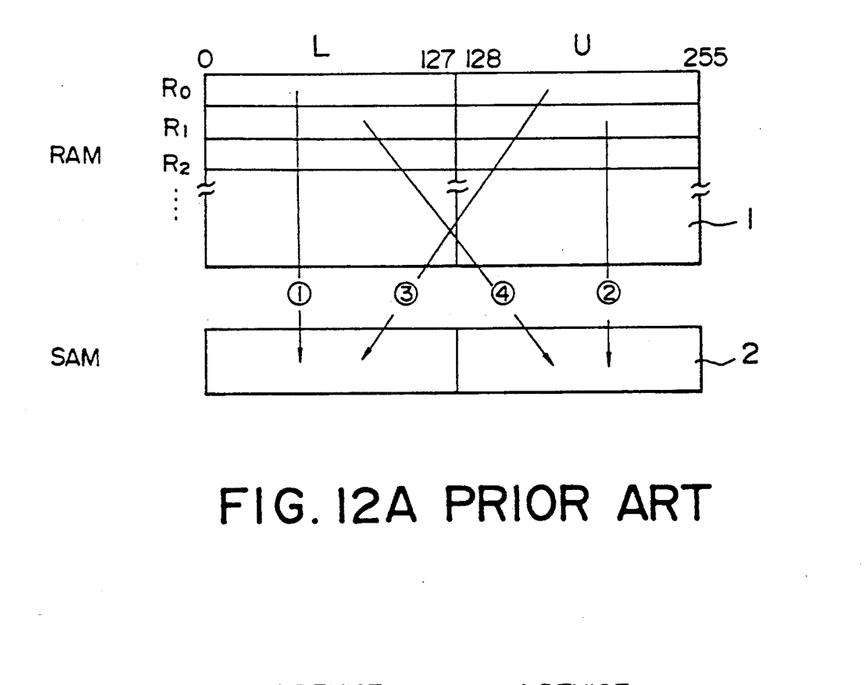
FIGS. 12A and 12B are explanatory views for explaining the problem of a conventional image memory in the case where there is employed a conventional transfer method in which a pixel area close to a square as far as possible is accessible in a page mode cycle by the split transfer system.
Figure 12B:
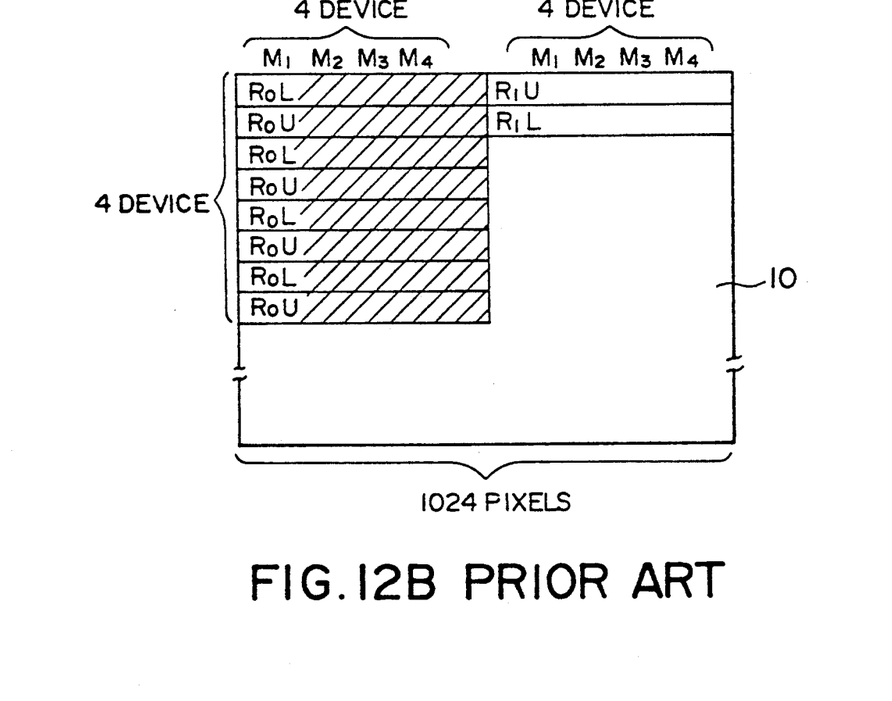

Let now consider the case where the picture size is different from that in the above-described case. The case where the number of pixels in a scanning direction is 1024 is shown in FIGS. 12A and 12B. When it is assumed that the size of a tile used is 4×4 in the same manner as that in the above-described case, 1024 pixels correspond to the two segmented SAM sections ($=1024/(4\times 128)$).

At this time, in order that L and U of split data of one row are caused to correspond to the pixel arrangement in a longitudinal direction, it is necessary to carry out a split transfer in order as shown in FIG. 12A. Namely, when transfer is carried out in order of R0L, R1U, R0U, R1L, ..., the area indicated by slanting lines in FIG. 12B can be desirably accessed in the page mode. However, in the case of transfer at this time, L and U cross each other with respect to SAM. Accordingly, such a transfer cannot be carried out by a conventional DPRAM. Naturally, when the size of the tile is changed, a buffer can be constructed even by this picture size without cross transfer. However, the design of the buffer memory system must be changed for every picture displayed. Further, since a cross transfer occurs unless the number of tiles in a scanning direction is necessarily odd as seen from the case of FIG. 10B, it cannot be necessarily said to select an optimum tile size of a memory capacity which is not wasteful with respect to a picture size.

SUMMARY OF THE INVENTION

Accordingly, an object of this invention is to provide an image memory which has no necessity to vary a buffer memory system for every size of picture displayed.

In accordance with this invention, there is provided an image memory comprising a random access memory accessible at random, a serial access memory including a main register and a preregister cyclically and serially accessed, data transfer means for carrying out data transfer between the random access memory and the serial access memory, and designation means for designating an address of a serial access, wherein the data transfer means serves to transfer data from the random access memory to the main register of the serial access memory through the preregister, and a serial access to the serial access memory is made on the basis of an address designated by the designation means.

In accordance with the image memory of this invention, transfer of data from the random access memory to the main register of the serial access memory is carried out through the preregister of the serial access memory by the data transfer means. That is, data is transferred from the random access memory to preregister during the time the main register is serially accessed. When the serial access of the main register reaches the last address, the data is transferred from the preregister to the main register. Further, serial access of data transferred to the main register is carried out on the basis of an address designated by the designation means. Thus, transfer of data from the random access memory to the serial access memory can be carried out without restrictions, and the length of data transmitted from the serial access memory to a picture displayed can be arbitrarily set, thus making it possible to cope with various sizes of pictures displayed without changing the buffer memory system.

DESCRIPTION OF THE PREFERRED EMBODIMENT

Figure 1:
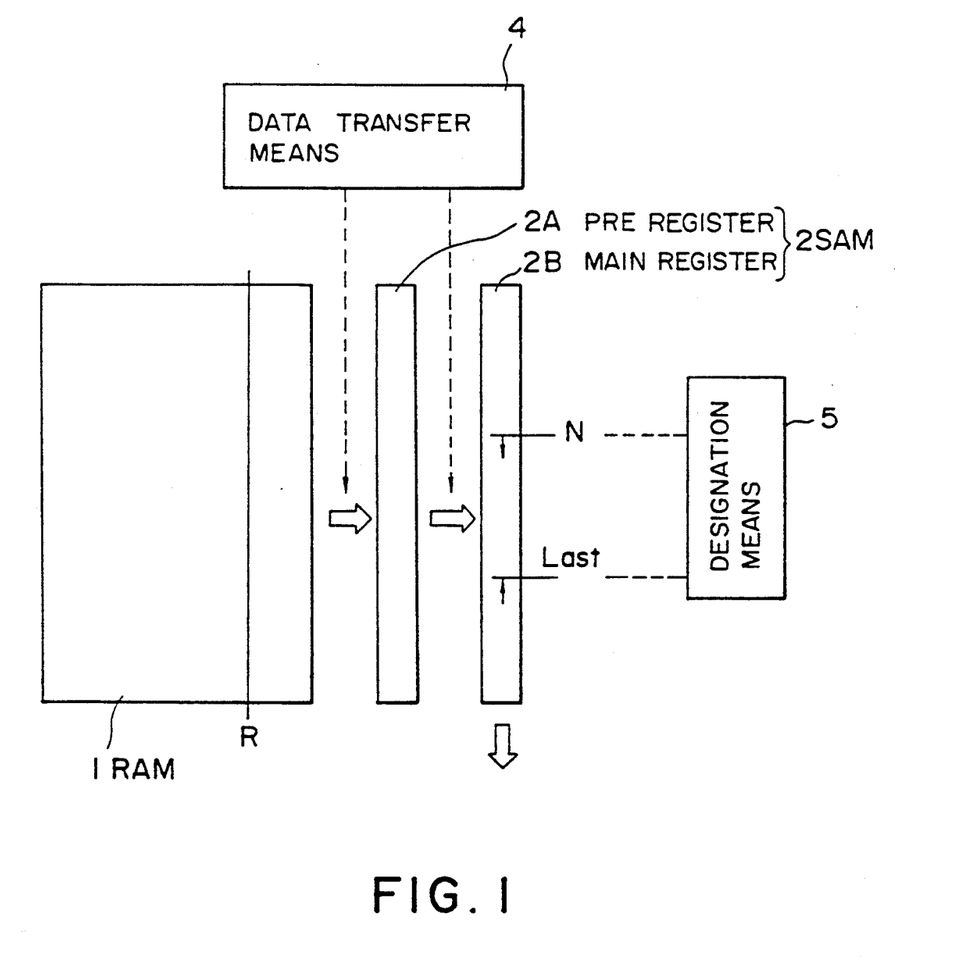
FIG. 1 is a block diagram showing an embodiment of an image memory according to this invention.

An embodiment of an image memory according to this invention is shown in FIG. 1. The image memory of this embodiment comprises a random access memory (hereinafter referred to as a RAM) 1, a serial access memory (hereinafter referred to as a SAM) 2, data transfer means 4, and designation means 5. The SAM 2 includes a preregister 2A, and a main register 2B cyclically and serially accessed. The data transfer means 4 carries out transfer of data between the RAM 1 and the SAM 2. In the case of transferring data from the RAM 1 to the main register 2B of the SAM 2, the data transfer means carries out this transfer through the preregister 2A.

The designation means 5 serves to designate addresses (a leading address N and a last address Last) of the serial access of the main register 2B.

Figure 2:
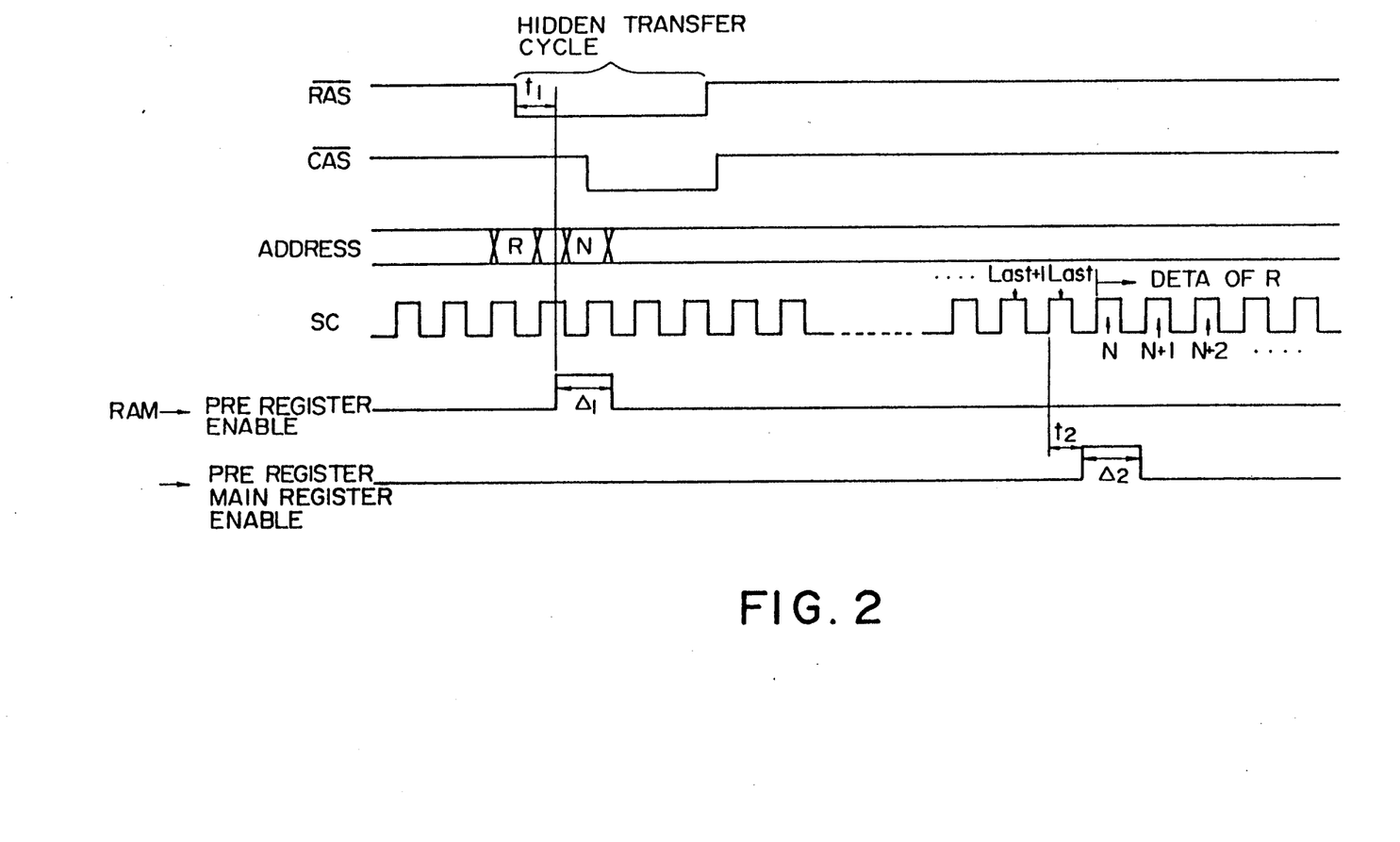
FIG. 2 is a timing chart for explaining the operation of the embodiment shown in FIG. 1.
Figure 8B:
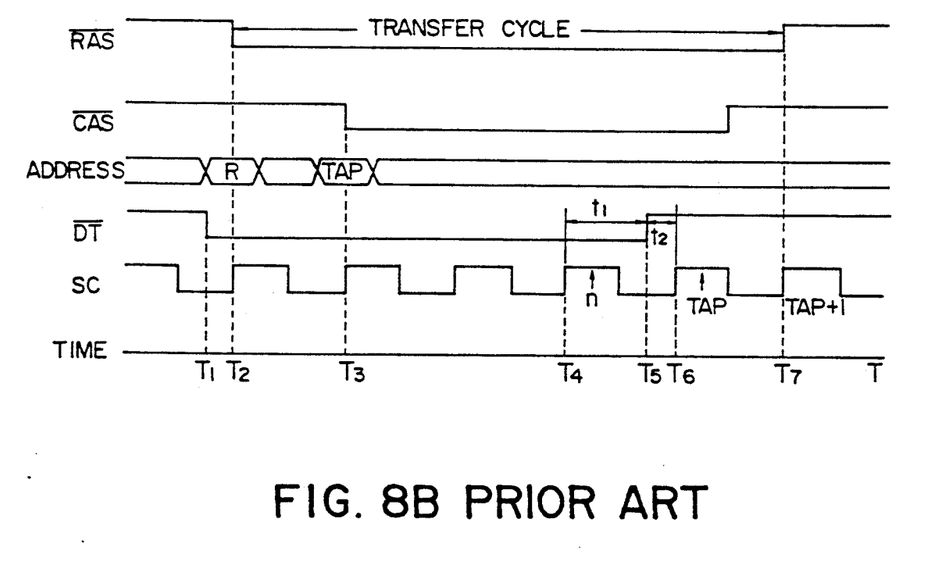

The operation of the above-described embodiment will now be described with reference to FIG. 2. For a time period during which the main register 2B is being serially accessed, when the operational mode enters the transfer cycle for transferring data from the RAM 1 to the SAM 2, in the same manner as in the prior art, the row address indicates a row of the RAM 1 transferred to the SAM 2, and the column address indicates a TAP address which is the leading address when data of this row is newly serially accessed. However, it is only between the RAM 1 and the preregister 2A that transfer is actually carried out by the data transfer means at the time of this transfer cycle. Accordingly, unlike the conventional image memory, there is no restriction on the timing as shown in FIG. 8B, and it cannot be seen from the external that transfer has been carried out. Therefore, this transfer will be called a hidden transfer cycle. In this hidden transfer cycle, transfer of data from the RAM 1 to the preregister 2A is carried out only for a fixed time period $\Delta_1$ after the time $t_1$ has passed from the time when the $\overline{RAS}$ has fallen. Thereafter, the data thus transferred is held at the preregister 2A. When the serial access advances, so an address subject to the serial access reaches an address designated by the designation means 5, transfer from the preregister 2A to the main register 2B is carried out by the data transfer means 4. The SC cycle labeled Last in FIG. 2 is an address designated in advance. When a fixed time $t_2$ has passed from the time of the rise of the signal SC of this address, transfer from the preregister 2A to the main register 2B is carried out only for a fixed time period $\Delta_2$. Thereafter, the preregister 2A and the main register 2B are separated with each other for a second time. In the SC cycle subsequent to the SC cycle Last, transferred row data are serially outputted from the TAP address, i.e., the column address N.

There are conceivable several methods of setting a last address where transfer from the preregister 2A to the main register 2B on the above-described hidden transfer cycle system is carried out. Representative methods thereof are shown in FIGS. 3 and 4.

Figure 3:
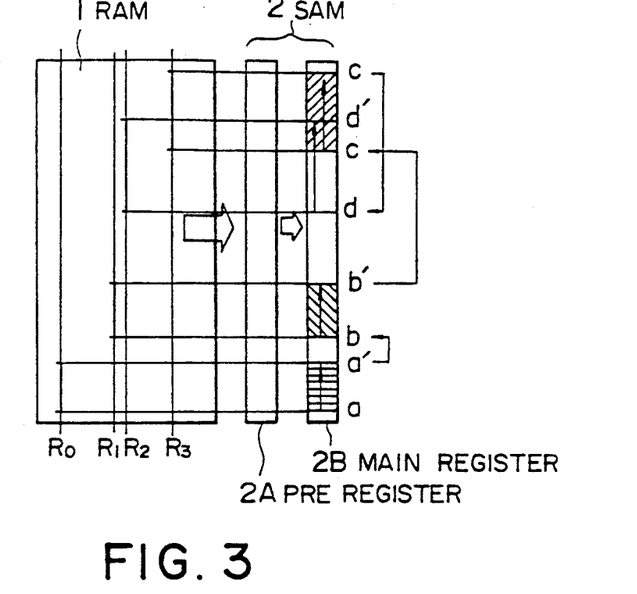
FIG. 3 is an explanatory view for explaining data transfer in the case where a leading address and a last address of a series of serial cycles are independently set.
Figure 4:
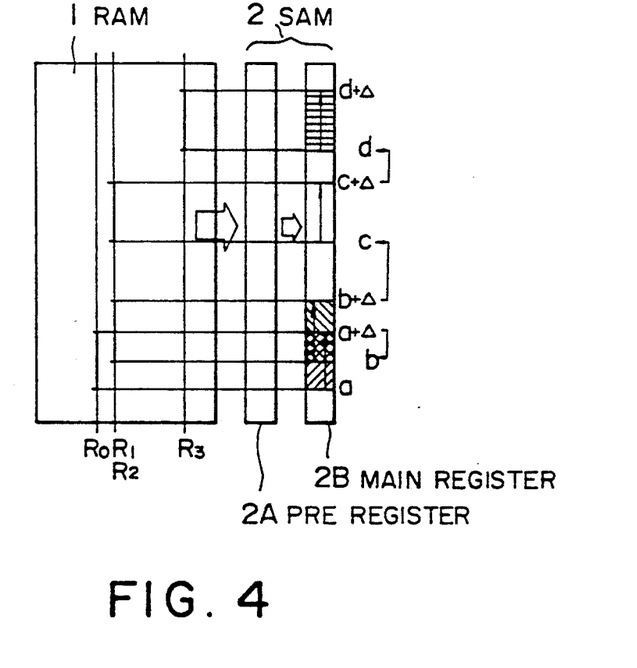
FIG. 4 is an explanatory view for explaining data transfer in the case where a leading address and a fixed increment up to a last address of a series of serial cycles are set by a fixed increment.

FIG. 3 shows the method in which a leading address and a last address of the serial access are given in the hidden transfer cycle. In FIG. 3, when the serial access of a→a' is completed, data of the row R1 is transferred from the preregister 2A to the main register 2B. Subsequently, a serial access of b→b' is completed, data of the row R3 is transferred from the preregister 2A to the main register 2B. Subsequently, a serial access of c→c' is carried out. When the serial access of c→c' is completed, data of the row R2 is transferred from the preregister 2A to the main register 2B. Subsequently, a serial access of d→d' is carried out. In addition, two methods are conceivable as the method of giving the last address.

As one method of giving a last address, at the time of the hidden transfer for the serial access time period of a→a', a leading address b and a last address b' of the next serial access b→b' are set. In this case, since the last address of the main register 2B being serially accessed is already determined, even if any hidden transfer does not occur until the access of the last address, the next leading address is not set when access reaches a'. Accordingly, a serial access from a is conducted for a second time, or a serial access from a predetermined address to another predetermined address is carried out.

As another method of giving a last address, at the time of hidden transfer for the serial access time period of a→a' which is the last address of a serial access being carried out and a leading address b of the next serial access are set. In this case, if hidden transfer is not conducted, since the last address of the access being serially accessed is not set, this serial access is continued, so the register of the SAM 2 is continued to be cyclically accessed until the last address is set in the hidden transfer cycle.

In FIG. 4, the last address is not directly given, and an increment $\Delta$ from the leading address to the last address is uniformly set independently of the hidden transfer cycle. In the hidden transfer cycle, only the leading address of the next serial access cycle is set. Namely, at the time of a hidden transfer for the time period of the serial cycle of a→(a+$\Delta$), the leading address b of the next serial cycle is set. When the address reaches the last address a+$\Delta$, data of the row R1 is transferred from the preregister 2A to the main register 2B. Thus, serial access of this data is initiated from the address b. At the time of a hidden transfer for the time period of the serial cycle of b→(b+$\Delta$), the leading address c of the next serial cycle is set. When the address reaches the last address b+$\Delta$, data of the row R2 (the same as the row R1 in this case) is transferred from the preregister 2A to the main register 2B. Thus, the serial access of this data is initiated from the address c. At the time of a hidden transfer for the time period of the next serial cycle of c→(c+$\Delta$), a leading address d of the next serial cycle is set. When the address reaches the last address c+$\Delta$, data of the row R3 is transferred from the preregister 2A to the main register 2B. Thus, the serial access of this data is initiated from the address d. In this case, since the last address of the register being serially accessed is already determined, if any hidden transfer does not occur until the access of the last address, the following operation is carried out. When the case of the serial access of a→(a+$\Delta$) is taken as an example, since the next leading address is not set when the access reaches the address a+$\Delta$, a serial access from a is conducted for a second time, or a serial access from a predetermined address to another predetermined address is conducted.

In the above-described method of setting the last address, the processing of the serial access when setting of a last address by the hidden transfer cycle is not set may be processing except for the above. For example, an approach may be employed such that serial access is continued irrespective of the method of setting a last address, and the main register 2B of the SAM 2 is continued to be cyclically accessed until the last address is set in the hidden transfer cycle.

How the configuration of picture data is efficiently carried out when transfer operation is carried out as stated above will now be described.

Figure 5A:
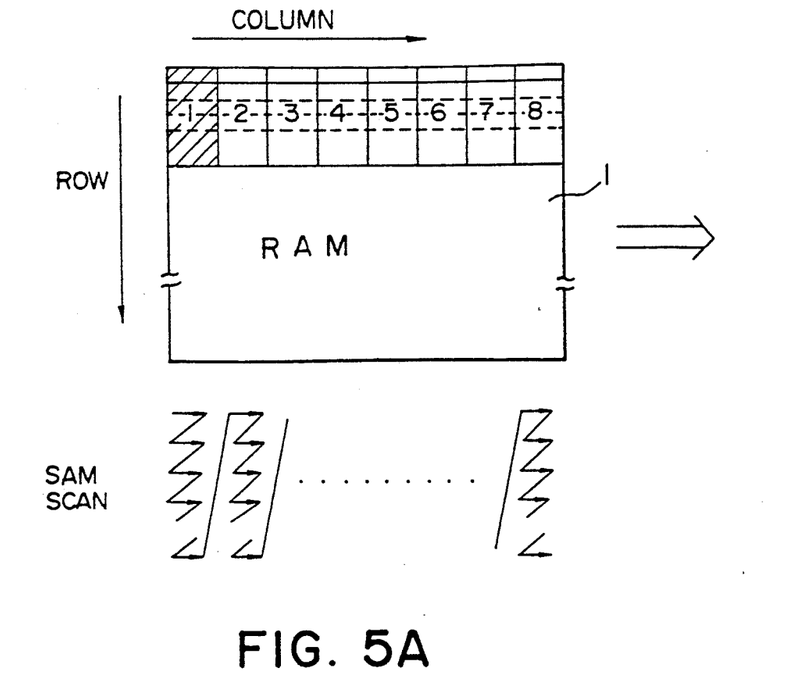
FIGS. 5A and 5B are conceptual views showing the correspondence relationship between RAM data and pixels of a picture displayed in the case of carrying out a high speed processing of data in a rectangular area of a picture displayed, respectively.
Figure 5B:
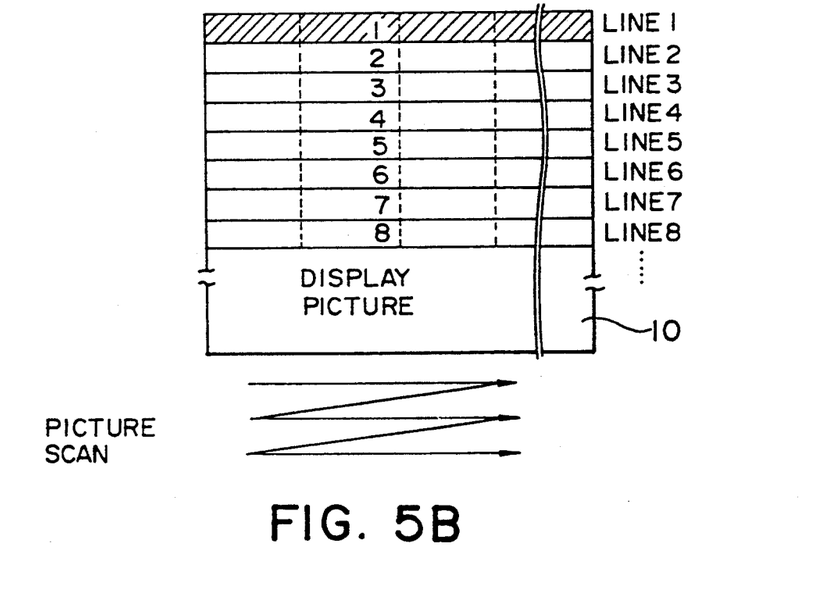

The correspondence relationship between the data structure in the RAM 1 and pixels of a display picture 10 will be described with reference to FIGS. 5A and 5B. As previously described, it is suitable for high speed processing of the display picture 10 to allow the pixel area close to a square as far as possible of the display picture 10 to be in correspondence with the column direction in which high speed access can be made in the RAM. Data corresponding to eight lines of the display picture 10 as shown in FIG. 5B will now be considered. Data at the portion in the column direction of a certain row of the RAM 1 are caused to correspond to pixel data in rectangular areas over eight lines of the display picture 10. Further, the slanting line portion of pixel data of one line shown in the display picture 10 is caused to correspond to the rectangular area 1 of the RAM 1. The correspondence relationship between the remaining RAM areas and the rectangular areas of the display picture 10 will be caused to be related to each other in the same manner as stated above. Scanning in displaying the picture 10 is conducted in order of lines 1, 2, 3, . . . On the other hand, data transfer from the RAM 1 to the SAM 2 is carried for every row. Accordingly, it is necessary to carry out a hidden transfer so that serial access to scan the area 1, the area 2, the area 3, . . . in order by the SAM 2 can be made. At this time, because of the hidden transfer, the restriction on timing as in the case of the prior art does not exist.

Figure 6A:
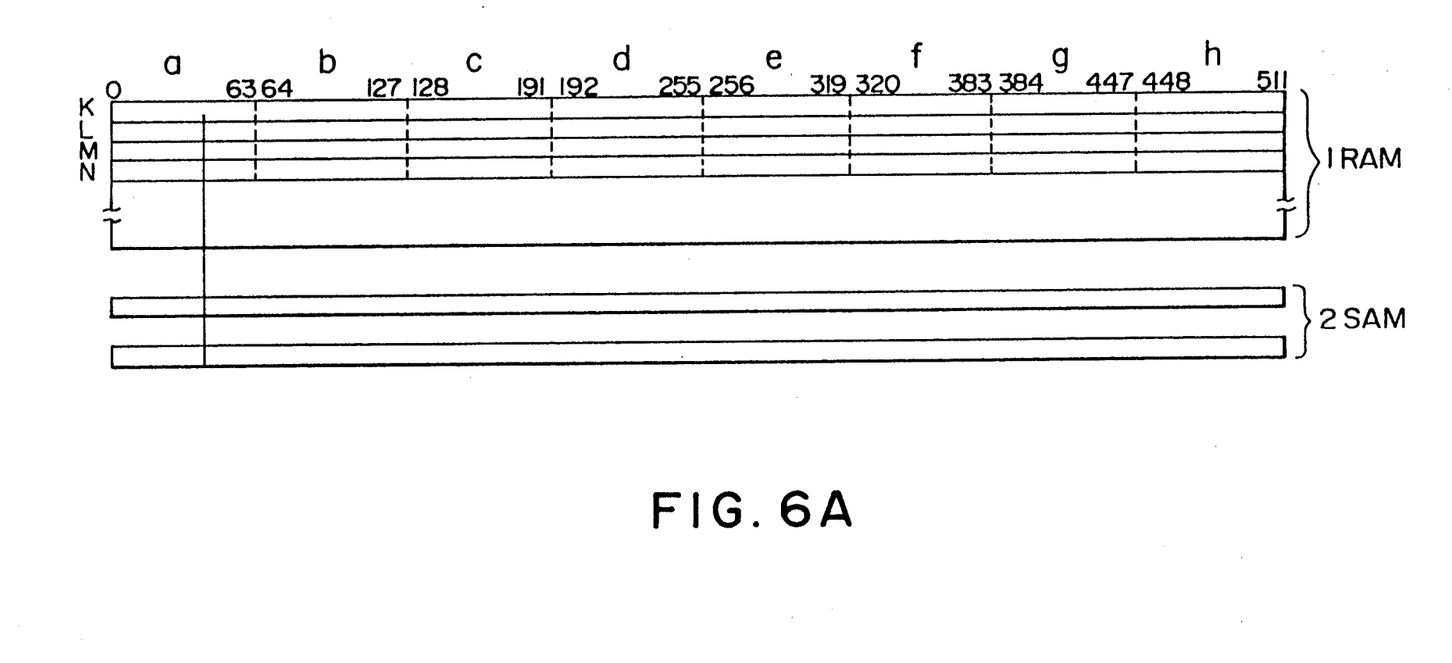
FIGS. 6A and 6B are explanatory views for explaining the correspondence relationship shown in FIGS. 5A and 5B in a more actual sense.
Figure 6B:
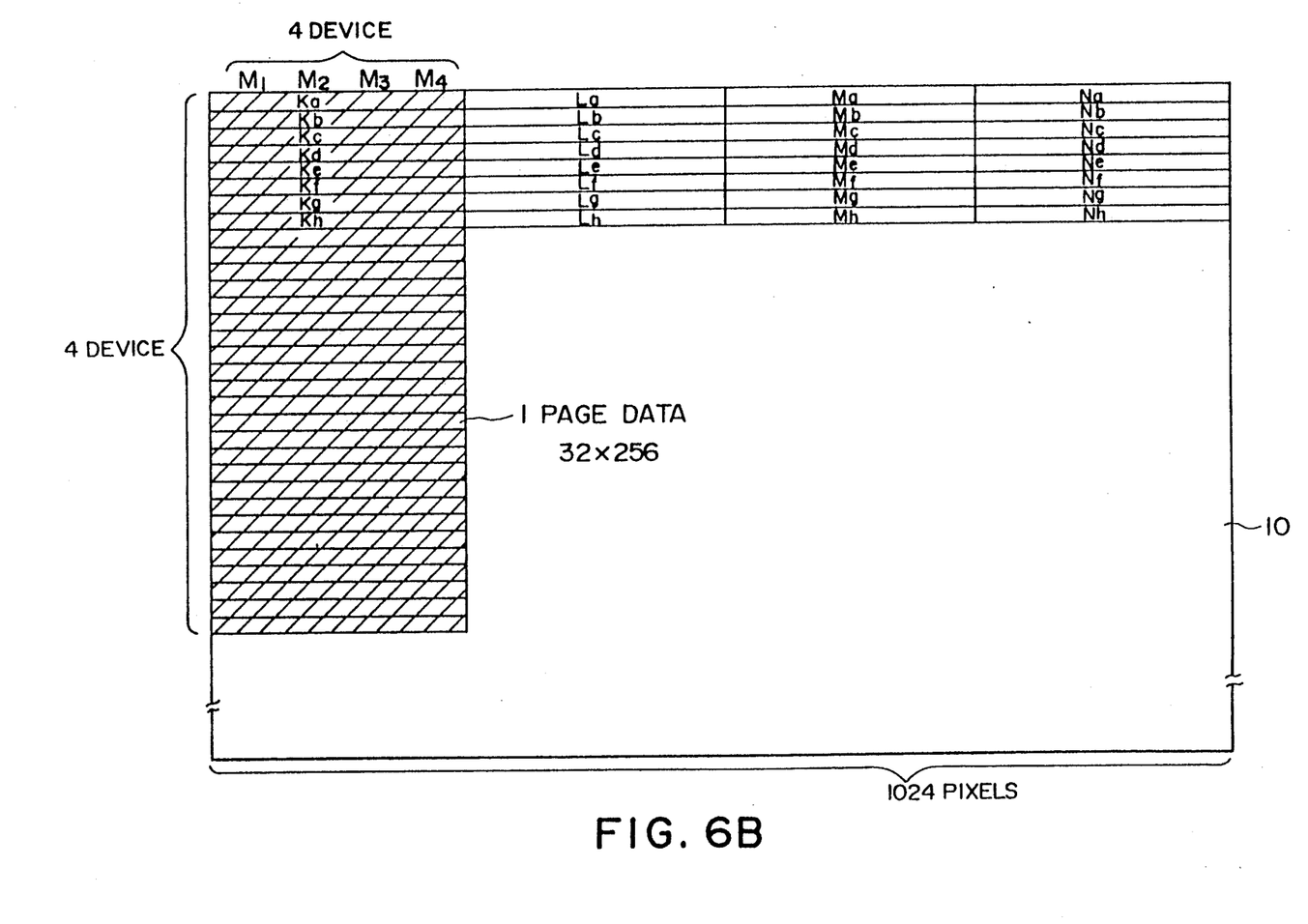

The correspondence relationship between data in the RAM 1 and data of the display picture 10 is shown in a more actual sense in FIGS. 6a and 6B. In FIGS. 6A and 6B, it is assumed that each line of the picture displayed 10 is comprised of 1024 pixels, and a picture is constituted by the tile of 4×4. The RAM 1 is comprised of 512 columns, and is divided or split into eight areas of a to h as shown in FIG. 6A. Assuming now that respective rows are called K, L, M, N, . . . and data of the area a of, e.g., the row K is represented by Ka, data of Ka to Kh constitute a rectangular area indicated by slanting lines of the picture 10 as shown in FIG. 6B. In this case, the number of pixels constituting the tile in the line direction is equal to 256 and the number thereof in the longitudinal direction is equal to 32. Accordingly, the area close to a square of the picture 10 can be subjected to a high speed access in the column direction of RAM 1, e.g., access in a page mode. Thus, high speed processing of the picture 10 can be carried out.

Figure 7A:
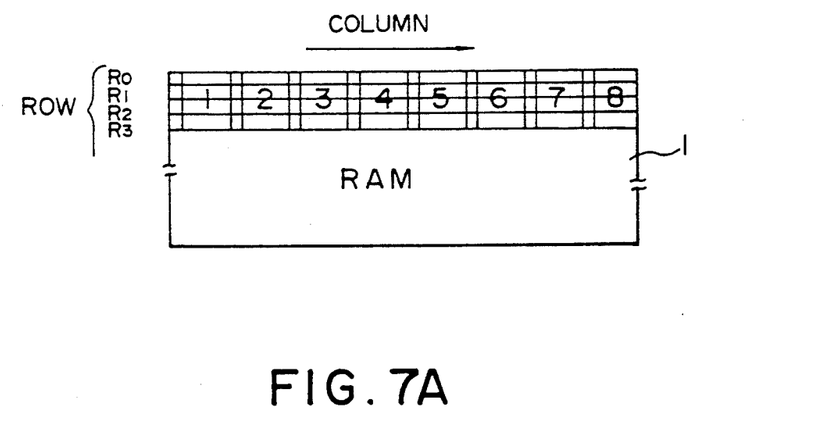
FIGS. 7A and 7B are explanatory views for explaining a transfer method to a picture displayed of RAM data when the actual correspondence relationships explained with reference to FIGS. 6A and 6B are used, respectively.
Figure 7B:
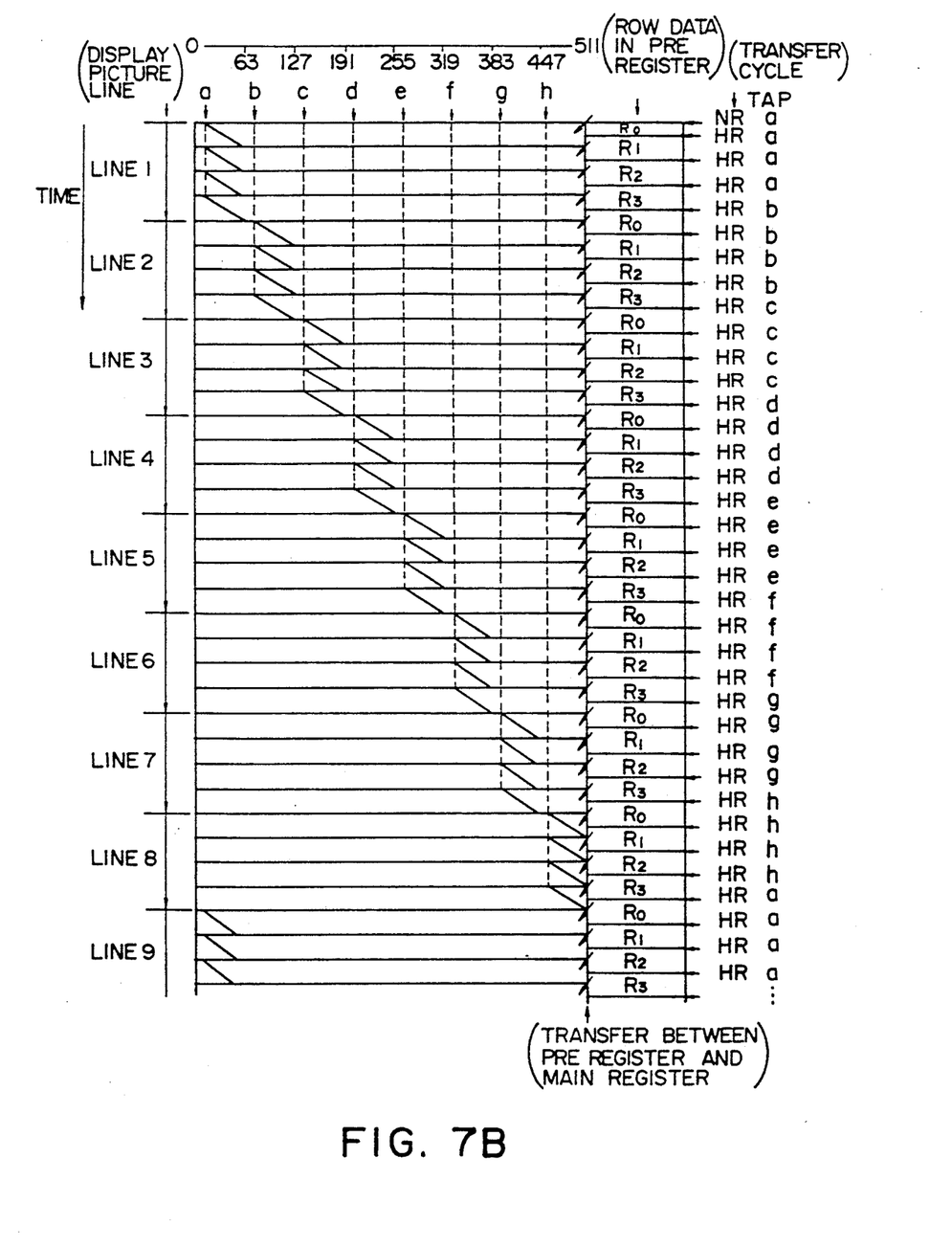

The actual method of transferring data indicative of picture displayed from the RAM 1 to the SAM 2 using the hidden transfer, and the method of making a serial access to the SAM 2 will now be described with reference to FIGS. 7A and 7B. The areas of 1 to 8 of the RAM 1 shown in FIG. 7A are substantially the same as the areas shown in FIG. 6A, but there are assumed data blank areas between those areas. Picture data corresponding to eight lines exist at the rows R0 to R3 of column addresses a to 63, b to 127, c to 191, d to 255, e to 319, f to 383, g to 447, and h to 511. In FIG. 7B, the ordinate represents a time which increases accordingly as the position on the ordinate shifts in a downward direction, and the abscissa represents column addresses of the SAM 2, changes in time of the row address of data in the preregister 2B, timings of the hidden transfer cycle, and the TAP addresses. The symbols NR and HR indicated at the item of the transfer cycle are abbreviations of a normal read transfer and a hidden read transfer, respectively. The normal read transfer is defined as the conventional transfer on a real time basis at the cycle of SC when the external signal $\overline{DT}$ is at "H" level. Further, as a method of setting the last address at the hidden read transfer, there is assumed a method of setting a last address of the SAM 2 being serially accessed and a TAP address of the SAM 2 serially accessed in the next time.

The operation will be described in succession in accordance with the time sequence. A procedure is taken to first implement the normal read transfer where the TAP address is a to the row R0 to shift data of the row R0 to the preregister 2A and the main register 2B to initiate the serial access from the address a. Then, a hidden read transfer such that the leading address is a and the last address is 63 is implemented to the row R1 during the serial access up to the address 63. At this time, the content of the preregister becomes in correspondence with data of the row R1. When the access shifts to the address 63, transfer from the preregister 2A to the main register 2B is automatically carried out, and data of the row R1 is continuously and serially outputted from the address a. Similarly, the data transfer and the serial access up to the row R3 are carried out. On the other hand, the portion in the scan direction (line direction) of the picture displayed 10 is divided or split into four areas as shown in FIG. 7B, and respective areas correspond to one row. Accordingly, data transfer of line 1 is completed at this stage. For a time period during which the address serially accessed reaches the address 63 which is the last address of the line 1, a hidden read transfer such that the leading address is b and the last address is 63 is implemented to the row R0. At this time, the content of the preregister 2A becomes equal to the data of the row R0. When the address accessed becomes equal to the address 63, transfer from the preregister 2A to the main register 2B is automatically carried out, and the data of the row R0 is serially outputted incessantly from the address b. During the serial access up to the address 127, a hidden read transfer such that the leading address is b and the last address is 127 is implemented to the row R1. At this time, the content of the preregister becomes equal to the data of the row R1. When the address accessed reaches the address 127, transfer from the preregister to the main register is automatically carried out, and the data of the row R1 is continuously and serially outputted from the address b. Similarly, the data transfer and the serial access up to the row R3 are carried out. After the data transfer and the serial access of the line 2 is completed, the operation similar to the above is continued except that the leading addresses and the last addresses of the TAP address change in succession on the line 3 and lines succeeding thereto as shown in FIG. 7B.

As described above, in accordance with this embodiment, an approach is employed to provide a preregister and a main register in the serial access memory, to thus set a hidden transfer to carry out a data transfer only between the random access memory and the preregister. Accordingly, it is possible to carry out a transfer operation without the necessity of critical timing as in the case of a conventional real time transfer, and to set the leading address and the last address which designate the width of a series of serial outputs. Thus, the serial access memory can be used with the divided segments having arbitrary lengths, respectively. For this reason, it is possible to cope with systems of any display picture size by controlling the transfer cycle and the TAP address. At this time, a pixel area which can be subjected to picture processing at a high speed page mode cycle is permitted to be as close to a square as possible. Thus, modification of picture in any direction of the picture can be made at a high speed.

While it has been described that the SAM section comprises main register and a preregister, these registers may be entirely equivalent ones, or the both registers may be replaced with each other. In this case, switching between the preregister and the main register may be carried out by switching connection of the register system to the input/output section of the SAM by an internal designation signal given from, e.g., data transfer means.

What is claimed is:

1. An image memory comprising:
   a random access memory accessible at random,
   a serial access memory including a main register and a preregister, said main register and preregister holding data and being cyclically and serially accessed,
   data transfer means for simultaneously transferring a group of data from said random access memory to said main register of said serial access memory through said preregister, and
   designation means for designating an address of a serial access for serial accessing of said serial access memory,
   wherein said data transfer means serves to transfer data from said random access memory to said preregister of said serial access memory during implementation of said serial access to said serial access memory on the basis of an address designated by said designation means.

2. An image memory as set forth in claim 1, wherein said designation means serves to designate a leading address and a last address of the serial access.

3. An image memory as set forth in claim 1, wherein said designation means serves to designate a leading address of the serial access and an address increment for setting a last address thereof.

4. An image memory as set forth in claim 1, wherein said designation means serves to designate a last address of the serial access and a leading address of register data serially accessed in the next time.

5. An image memory as set forth in claim 1, wherein said data transfer means responds to a data transfer command to transfer data from said random access memory to said preregister before a serial access to a last address designated by said designation means is provided, and to transfer data from said preregister to said main register immediately after a serial access to said last address is provided.

6. An image memory as set forth in claim 5, wherein a data transfer from said preregister to said main register is implemented in a hidden cycle period.

7. An image memory as set forth in claim 1, wherein said main register and said preregister are of the same structure, and can be replaced with each other, these switchings being carried out by switching connection of the register system to the input/output section of said serial access memory by an internal designation signal.

* * * * *